(12) United States Patent
Dixit et al.

(10) Patent No.: US 8,525,566 B2
(45) Date of Patent: Sep. 3, 2013

(54) GLITCH HARDENED FLOP REPEATER

(75) Inventors: Anand Dixit, Mountain View, CA (US); Robert P. Masleid, Monte Sereno, CA (US)

(73) Assignee: Oracle International Corporation, Redwood City, CA (US)

( * ) Notice: Subject to any disclaimer, the term of this patent is extended or adjusted under 35 U.S.C. 154(b) by 30 days.

(21) Appl. No.: 13/210,587

(22) Filed: Aug. 16, 2011

(65) Prior Publication Data

US 2013/0043921 A1 Feb. 21, 2013

(51) Int. Cl.
*H03K 3/00* (2006.01)
(52) U.S. Cl.
USPC ......................................................... 327/218
(58) Field of Classification Search
USPC ................. 327/108, 112, 208, 210, 211, 214, 327/215, 218, 219, 276–278, 281; 326/23, 326/27
See application file for complete search history.

(56) References Cited

U.S. PATENT DOCUMENTS

| 6,426,652 | B1 | 7/2002 | Greenhill |
| 7,071,747 | B1 | 7/2006 | Masleid |
| 7,119,580 | B2 | 10/2006 | Masleid |
| 7,256,634 | B2 * | 8/2007 | Masleid ........................ 327/218 |

* cited by examiner

*Primary Examiner* — Lincoln Donovan
*Assistant Examiner* — Sibin Chen
(74) *Attorney, Agent, or Firm* — Meyertons, Hood, Kivlin, Kowert & Goetzel, P.C.; Erik A. Heter

(57) ABSTRACT

A repeater circuit is disclosed. The circuit includes an input stage configured to receive an input signal and a clock signal. An output stage is configured to drive an output signal on an output node to a first state responsive to a first transition of the input signal on the input node concurrent with a first phase of the clock signal. The input stage is configured to activate a first driver circuit of the output stage responsive to a first transition of the input signal. A reverse stage is configured to assert a first inhibit signal at a delay time subsequent to activation of the first driver circuit, which is configured to be deactivated responsive to assertion of the first inhibit signal. Assertion of the first inhibit signal is prevented responsive to a second transition of the input data signal occurring before the delay time has elapsed.

17 Claims, 5 Drawing Sheets

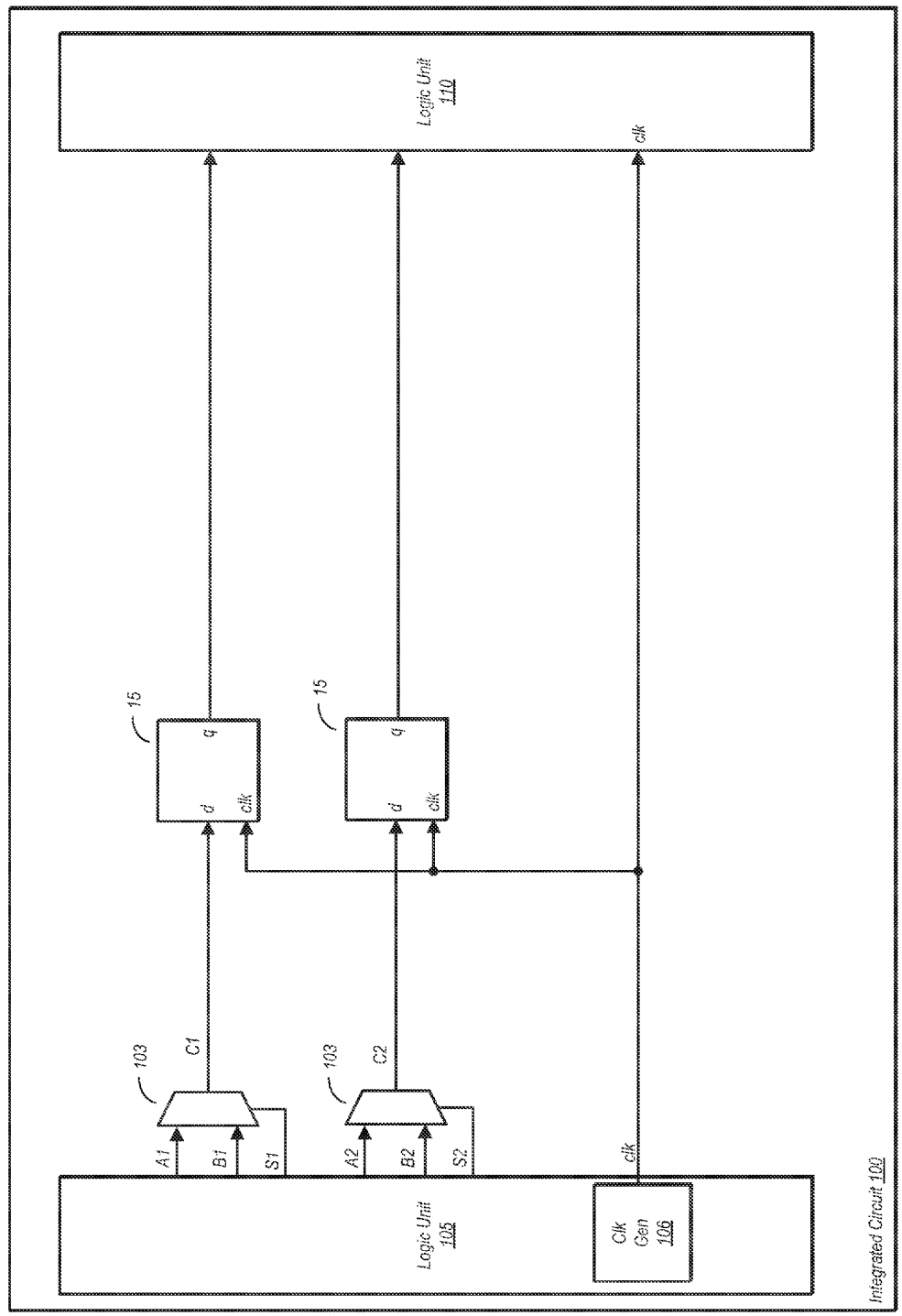

GLITCH HARDENED FLOP REPEATER

BACKGROUND

1. Field of the Invention

This invention relates to electronic circuits, and more particularly to repeater circuits.

2. Description of the Related Art

As integrated circuit (IC) technology advances, the speeds at which IC's operate increases while operating voltages generally decrease. As such, the distances at which signals propagate on a die become an increasingly important factor to consider in IC design. At longer distances, on-die interconnects between a transmitter and a receiver can develop enough resistance and enough capacitance that the signal transition at the receiver can be adversely affected. Excessive propagation delay across a long signal interconnect can affect the transition at the receiver in terms of both timing and voltage levels. For example, a signal that propagates too slowly across an interconnect may in some cases not allow sufficient set-up and hold time for the receiver to properly transition from one logic level to another. Furthermore, a slow transition can cause crowbar currents in some receivers, which can lead to increased power consumption and may further lead to circuit damage in more severe cases.

In order to combat the negative effects of long signal interconnects, repeater circuits may be implemented. More particularly, repeater circuits may be placed along a signal path between a transmitter and receiver, effectively breaking a single interconnect into two or more interconnects. In such a configuration, repeater circuits may overcome some of the problems of resistance and capacitance that would be present in a single signal interconnect, and may further cause faster transition times at the receiver.

Repeater circuits may be simple or complex. The simplest interconnect circuits may be implemented using an inverter, with a double inverter (i.e. a buffer) being an alternative if no logical inversion is desired. Complex repeater circuits may use dynamic logic to turn on output drivers responsive to a transition on an input node and subsequently turn these output drivers off after the transition has been driven on an output node.

In some cases, the length of a signal path between two points on an IC die may have a propagation time that is longer than a clock cycle at which the IC operates. Accordingly, it may be necessary to store the state of the transmitted signal across a clock boundary. One solution for such a situation is to use a flip-flop, rather than using a repeater circuit.

SUMMARY OF THE DISCLOSURE

A repeater circuit is disclosed. In one embodiment, the circuit includes an input stage configured to receive an input data signal and further configured to receive a clock signal having a first phase and a second phase. The circuit further includes an output stage configured to drive an output signal on an output node to a first state responsive to a first transition of the input data signal on the input node concurrent with a first phase of the clock signal. The input stage is configured to activate a first driver circuit of the output stage responsive to detecting the first transition of the input data signal. The circuit further includes a reverse stage configured to assert a first inhibit signal at a delay time subsequent to activation of the first driver circuit. The first driver circuit is configured to be deactivated responsive to assertion of the first inhibit signal. The reverse stage is further configured to prevent assertion of the first inhibit signal responsive to a second transition of the input data signal occurring before the delay time has elapsed subsequent to the first transition of the input data signal.

In one embodiment, a repeater circuit includes an input stage having first and second input circuits each coupled to receive an input data signal and a clock signal. The repeater circuit further includes an output stage having first and second driver circuits each coupled to an output node. The first driver circuit is configured to drive the output node responsive to activation of the first input circuit, and the second driver circuit is configured to drive the output node responsive to activation of the second input circuit. A reverse stage having first and second reverse circuits is also included in the repeater circuit. The first reverse circuit is configured to assert a first inhibit signal responsive to receiving a state signal in a first logic state and a feedback signal in the first logic state. The first reverse circuit is configured to cause the first driver circuit to be inactive responsive to assertion of the first inhibit signal. The second reverse circuit is configured to assert a second inhibit signal responsive to receiving the state signal in a second logic state and the feedback signal in the second logic state. The second reverse circuit is configured to cause the second driver circuit to be inactive responsive to assertion of the second inhibit signal.

BRIEF DESCRIPTION OF THE DRAWINGS

Other aspects of the disclosure will become apparent upon reading the following detailed description and upon reference to the accompanying drawings in which:

FIG. 5 is a block diagram of one embodiment of an integrated circuit.

Figure 1:
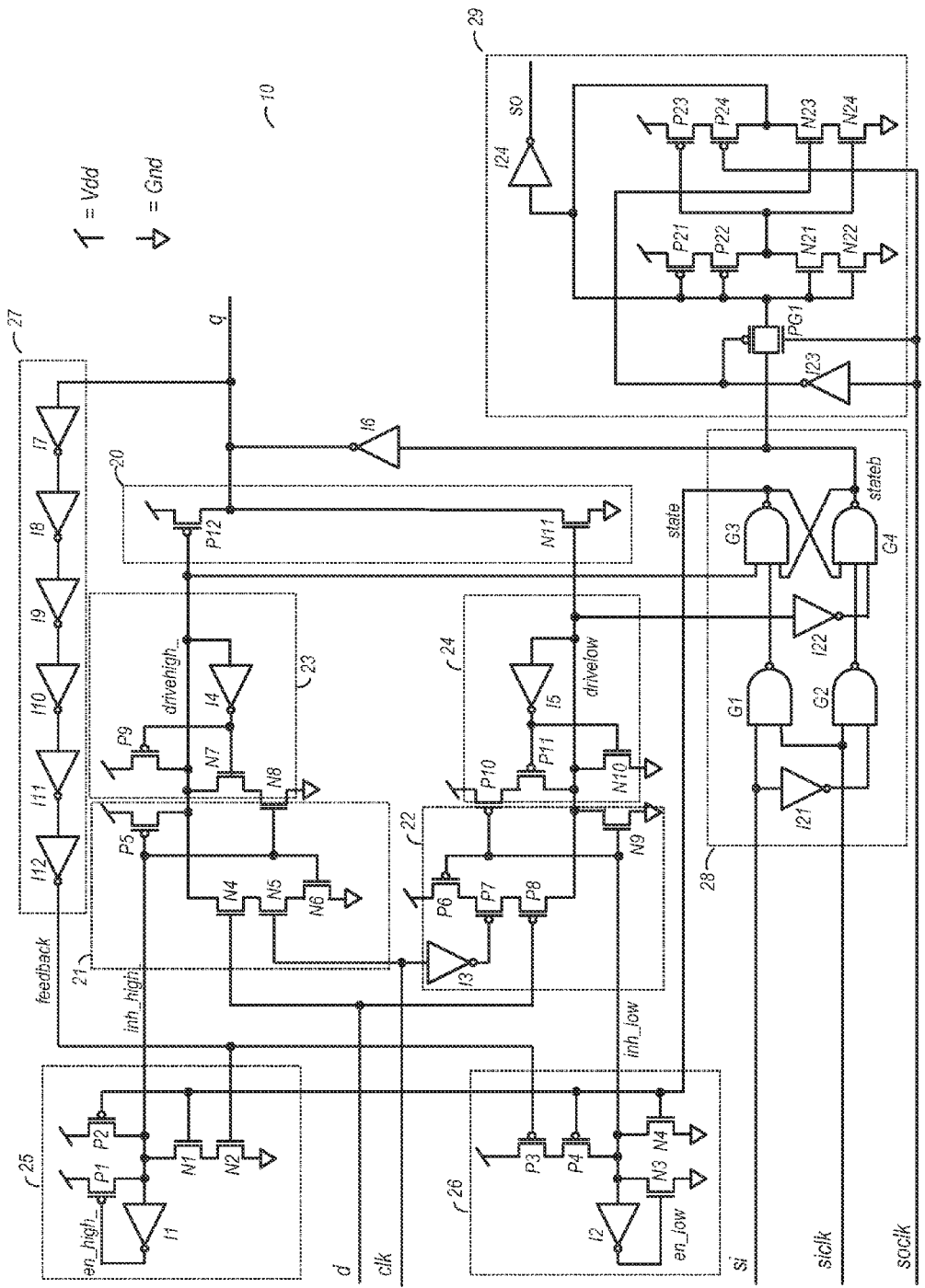
FIG. 1 is a schematic diagram of one embodiment of a repeater circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Overview:

The present disclosure is directed to a repeater circuit that is arranged to recover from glitches (i.e. temporary unintended transitions) of the input signal. The repeater may be implemented as a flop repeater (i.e. clocked, with ability to hold the output state of the repeater during the inactive phase of the clock). The repeater circuit may include a pair of input circuits each configured to activate a corresponding driver circuit responsive to a logical transition on an input node of an input data signal during the active phase of the clock. For example, a first input circuit is configured to activate a first driver circuit responsive to a low-to-high transition of the input data signal when the clock signal is in its active (e.g., high) phase. The first driver circuit may then drive a corresponding signal (e.g., at a logic high level) on an output node.

The repeater circuit may be implemented as domino logic, and may thus turn off the first driver circuit at a delay time subsequent to its activation. The output state may then be held by a keeper circuit until the next transition of the input signal that is concurrent with the clock signal being active.

The repeater circuit as disclosed herein also includes first and second reverse circuits. The reverse circuits may "arm" (i.e. enable) the input circuit to perform a transition in the opposite direction in order to enable the repeater circuit to recover from a glitch. For example, if a temporary, negative-going glitch occurs on the input node subsequent to a low-to-high transition, a first reverse circuit may enable the first driver circuit, regardless of whether it was enabled or disabled at the time when the glitch occurred. When the signal on the input node returns again to the high level, the first input circuit may again activate and cause a corresponding activation of the first driver circuit, without any substantial delay. Thus the repeater circuit is enabled to recover from the glitch and thereby ensure that the correct logic value is conveyed on the output node.

As noted above, an activated input circuit may be deactivated at a delay time subsequent to its activation. The delay may be determined by a feedback circuit coupled between the output node and the reverse circuits. The feedback circuit may receive the output signal transition on its input and provide a corresponding feedback signal to the reverse circuits, at the delay time subsequent to receiving the output signal transition. Various embodiments of the repeater circuit may also include scan master and scan slave latches. The scan master may be configured to provide as an output a state signal, based on a state of the output signal, to the first and second reverse circuits. The first and second reverse circuits may generate corresponding inhibit signals based on the received state signal as well as the state of the received feedback signal. Additional details of various circuit embodiments will now be discussed in reference to FIGS. 1 and 2.

Circuit Embodiments:

Turning now to FIG. 1, a schematic diagram of one embodiment of a flop repeater circuit is shown. In the embodiment shown, repeater circuit 10 includes an input stage including input circuits 21 and 22 and an output stage 20 including driver circuits in the form of transistors P12 and N11. A pair or keepers 23 and 24 are coupled between the input stage and the output stage. Repeater circuit 10 also includes a first reverse circuit 25 and a second reverse circuit 26. As will be discussed in further detail below, reverse circuits 25 and 26 may provide functionality that enables repeater circuit 10 to recover from a glitch. A feedback circuit 27 is coupled to receive a signal from the 'q' output of repeater circuit 10, and is configured to provide a feedback signal ('feedback') to each of the first second reverse circuits. Repeater circuit 10 also includes a scan master latch 28 and a scan slave latch 29. Scan master latch is coupled to provide a state signal ('state') to reverse circuit 25 and 26 in the embodiment shown.

It is noted that transistors designated with a 'P' in this example are p-channel metal oxide semiconductor (PMOS) transistors, while those designated with an 'N' are re-channel metal oxide semiconductor (NMOS) transistors. It is further noted that embodiments implemented using other technologies (e.g., graphene transistors) are possible and contemplated.

In the embodiment shown, each of input circuits 21 and 22 are coupled to receive an input data signal ('d') and a clock signal ('clk'). Input circuit 22 includes an inverter I3 that inverts the clock and provides the corresponding output do the gate terminal of transistor P7. The clock signal may be used for gating purposes with respect to input circuits 21 and 22. When the clock signal is low, transistors P7 and N5 are held inactive, and thus input circuits 21 and 22 are disabled. When the clock signal is high, transistors P7 and N5 may be activated, and input circuits 21 and 22 are operable to respond to corresponding transitions of the input data signal received on the input node.

Input circuit 21 is coupled to receive a first inhibit signal ('inh_high_) that is active low (i.e. asserted when low) from reverse circuit 25. Similarly, input circuit 22 is coupled to receive a second inhibit signal ('inh_low) that is active high (i.e. asserted when high).

Input circuit 21 in this embodiment implements a pull-down stack including transistors N4, N5, and N6. Activation of the pull-down stack when each of these transistors is active. Transistor N4 is coupled to receive the data input signal on its gate terminal, and is activated when the input data signal transitions high. Transistor N5 is coupled to receive the clock signal on its gate terminal, and is active when the clock is high. Transistor N6 is coupled to receive the first inhibit signal on its first gate terminal, and is active when this signal is high. Thus, when transistors N4, N5, and N6 are simultaneously receiving highs on their respective gate terminals, the pull-down stack is active. When the pull-down network is active, the 'drivehigh_' node is pulled low, thereby activating transistor P12. When P12 is active, the output node is driven high.

Input circuit 22 in the embodiment shown implements a pull-up stack that includes transistors P6, P7, and P8. Transistor P8 is coupled to receive the input data signal on its respective gate terminal, and is active when this signal is low. Transistor P7 is coupled to receive the output of inverter I3, which outputs a low when the clock signal is high. Transistor P6 is coupled to receive the second inhibit signal on its gate terminal, and is active when this signal is low. When transistors P6, P7 and P8 are simultaneously active, the pull-up stack is activated and the 'drivelow' node is pulled high. When 'drivelow' is pulled high, transistor N11 is activated, and drives the output node ('q') low.

Scan master latch 28 in this example includes inputs coupled to the 'drivehigh_' and 'drivelow' nodes. When the pull-down stack of input circuit 21 pulls 'drivehigh_' low, the low is received by an input of NAND gate G3, which causes its output to transition from a low (logic 0) to a high (logic 1). When the pull-up stack of input circuit 22 pulls 'drivelow' high, the high is received by inverter I22, which then outputs a low to an input of NAND gate G4. This causes the output of NAND gate G4, to transition from low to high, and in turn causes the state signal output by NAND gate G3 to transition from high to low. As noted above, reverse circuits 25 and 26 may receive the state signal.

In addition to receiving the state signal, reverse circuits 25 and 26 are also coupled to receive the feedback signal output from feedback circuit 27. In the embodiment shown, feedback circuit 27 includes inverters I7-I12. Since the number of inverters is even in this particular example, the feedback signal may be output at the same logic level (high or low) as the output signal at a delay time after a transition. For example, if the output signal transitions from a low to a high, feedback circuit 27 may output the feedback signal as a high at the delay time subsequent to the transition.

Reverse circuits 25 and 26 each include a respective pull-up network and a respective pull-down network coupled to receive the state signal. The pull-up network in reverse circuit 25 in this embodiment is implemented with a single device, transistor P2. Thus, when the state signal is low, transistor P2 is activated and thus pulls the first inhibit signal high. The pull-down network of reverse circuit 26 is implemented using a single device, N4. Accordingly, when the state signal is high, transistor N4 is activated and thus pulls the second inhibit signal low. As noted above, the first inhibit signal is considered to be asserted low, and thus, the activation of transistor P2 de-asserts this signal. Similarly, since the second inhibit signal is considered asserted when high, the activation of transistor N4 de-asserts this signal.

The pull-down network of reverse circuit 25 in the embodiment shown is implemented with transistors N1 and N2. The gate terminal of transistor N1 is coupled to receive the state signal, while the gate terminal of N2 is coupled to receive the feedback signal. As noted above, a low-to-high transition of the input data signal (when the clock and first inhibit signals are also high) causes the 'drivehigh_' node to be pulled low and correspondingly causes the state signal to transition high. Furthermore, the low-to-high transition appearing on the output node propagates through feedback circuit 27 and is output as the feedback signal. Thus, at the delay time subsequent to the low-to-high transition of the output node, both the feedback and state signals are high. When both of these signals are high, N1 and N2 are activated, and the first inhibit signal is asserted by being pulled low. Responsive to assertion of the first inhibit signal, transistor N6 is deactivated, thereby deactivating the pull-down stack of input circuit 21. Furthermore, responsive to the assertion of the first inhibit signal, transistor P5 is activated and thus the 'drivehigh_' node is pulled high. When the 'drivehigh_' node is pulled high, transistor P12 is deactivated. However, inverter I6 maintains the high on the 'q' output until the next high-to-low transition that occurs on the input node concurrent with the clock signal being high.

The pull-up network of reverse circuit 26 is also coupled to receive the state and feedback signals. Responsive to a high-to-low transition of the input data signal when the clock is high and the second inhibit signal is low activates the pull-up stack of input circuit 22 and pulls the 'drivelow' node high. Responsive to the 'drivelow' node being pulled high, the state signal output by scan master latch 28 falls low. Transistor N11 is also activated when 'drivelow' is pulled high, thereby causing the output signal to be driven low. At the delay time subsequent to the high-to-low transition of the output signal, feedback circuit 27 outputs the feedback signal as a low. Thus, when the state and feedback signals are low, transistors P3 and P4 are active, and thus the second inhibit signal is asserted as a logic high. Responsive to assertion of the second inhibit signal, transistor P6 is deactivated, thereby deactivating the pull-up stack of input circuit 22, while transistor N9 is activated. The activation of transistor N9 causes the 'drivelow' node to be pulled low, thereby deactivating transistor N11. Inverter I6 may maintain the low on the output node 'q' until the next low-to-high transition of the input signal that occurs concurrent with the clock signal being high.

Each of reverse circuits 25 and 26 implement a keeper function to hold the value of their respectively generated inhibit signals. Reverse circuit 25 implements a keeper using inverter I1 and transistor P1. As previously noted, when the state signal falls low, transistor P2 is activated and thus de-asserts the first inhibit signal by pulling it high. However, when a low-to-high transition of the input data signal causes a corresponding transition of the state signal, a condition may exist in which transistor P2 is turned off but the pull-down network of N1 and N2 is not yet active. This condition exists when state is high but the feedback signal is still low, prior to the propagation of the high through feedback circuit 27. Accordingly, since P2 is inactive and the pull-down network of N1 and N2 is also inactive, the keeper formed by inverter I1 and transistor P1 maintains the first inhibit signal in its high, de-asserted state. This state is maintained until overridden by activation of the pull-down network.

The keeper of reverse circuit 26 in the illustrated embodiment functions in a similar manner. When the state signal transitions from high to low prior to the concurrent activation of transistors P3 and P4, the keeper implemented with inverter I2 and transistor N3 holds the second inhibit signal de-asserted low. The de-asserted state is maintained until the pull-up network of reverse circuit 26 is activated, which occurs when both the state and feedback signals are low.

Repeater circuit 10 also includes keepers 23 and 24, which are arranged to maintain a state of the 'drivehigh_' and 'drivelow' nodes, respectively. Keeper 23 includes transistors P9, N7, N8, and inverter I4. It is noted that the first inhibit signal is at its high, de-asserted state in order for the 'drivehigh_' node to be low in this embodiment. When 'drivehigh_' is low, inverter I4 outputs a high to the gate terminal of transistor N7. When transistors N7 and N8 are active, 'drivehigh_' is pulled low. When the first inhibit signal is asserted low, transistor P5 is activated while transistors N6 and N8 are deactivated. This in turn causes 'drivehigh_' to be pulled high. When 'drivehigh_ is pulled high, inverter I4 outputs a low, which in turn causes the activation of transistor P9 and deactivation of transistor N7. If the first inhibit signal is subsequently driven high, keeper 23 may maintain 'drivehigh_' as a high until the pull-down stack of N4, N5, and N6 is activated.

Keeper 24 functions similarly to keeper 23. In order to pull the 'drivelow' node high, the second inhibit signal is at its de-asserted, low level in this embodiment. When 'drivelow' is pulled high, inverter I5 outputs a low to respective gate terminals of transistors P11 and N10. Since transistor P10 receives a low on its gate terminal when the second inhibit signal is low, the low on the gate of transistor P11 results in both of these devices being active, thereby providing a pull-up path between 'drivelow' and Vdd. When the second inhibit signal is asserted high, transistors P6 and P10 are deactivated, thereby cutting off the pull-up path. Transistor N9 is activated responsive to the assertion of the second inhibit signal, and thus 'drivelow' is pulled low. When 'drivelow' is pulled low, inverter I5 outputs a high to transistors P11 and N10, thereby inhibiting activation of the former while causing activation of the latter.

In addition to the normal functionality described above, scan master latch and scan slave latch 29 may enable the inputting of test stimulus data or the capture of test result data during scan testing operations. In addition to the inputs from the 'drivehigh_' and 'drivelow' nodes, scan master latch is also coupled to receive scan data through a scan data input ('si') and a scan input clock (via 'siclk'). NAND gate G1 may receive scan data on one of its inputs, while NAND gate G2 receives the complement of the scan data, via inverter I21. Both NAND gates G1 and G2 receive the scan input clock, and may propagate their respective outputs when the scan input clock is high. NAND gates G3 and G4 are cross-coupled, and may output complementary states with respect to one another. The state signal may be propagated to the reverse circuits, while the complement of the state signal may be propagated to inverter I6 and to scan slave latch 29.

Scan slave latch 29 in the embodiment shown is coupled to receive a scan output clock via a corresponding input ('soclk'). When the scan output clock is high, the NMOS transistor of PG1 may receive a logic high on its gate terminal, while the PMOS transistor of PG1 receives, via inverter I23, a logic low. Accordingly, passgate PG1 is active when the scan output clock is high and thus transparent to the output of NAND gate G4. Scan slave latch 29 also includes a first inverter (formed by transistors P21, P22, N21, and N22), a second, clock-gated inverter (formed by transistors P23, P24, N23, and N24), and a third inverter, I24.

Figure 2:
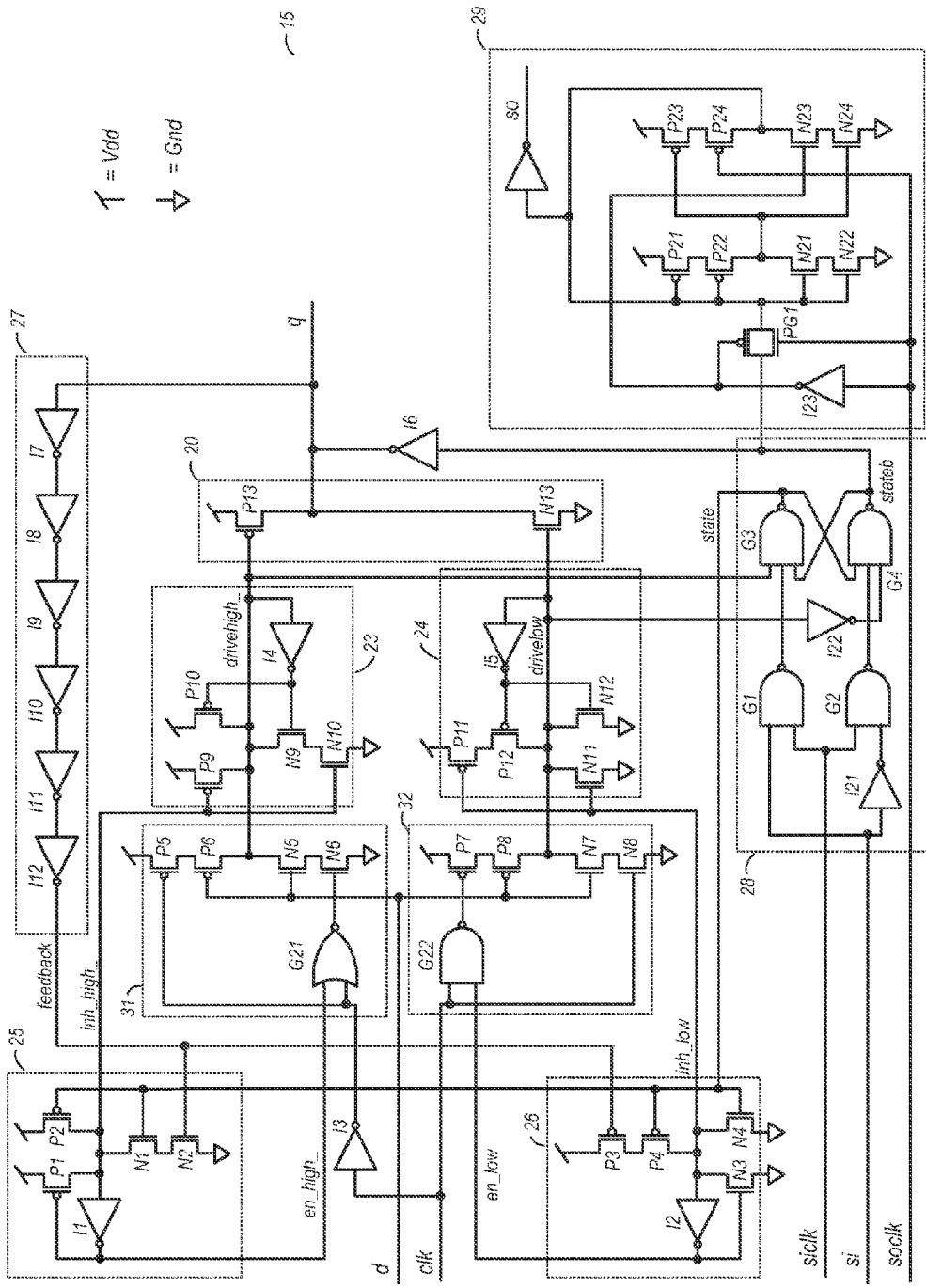
FIG. 2 is a schematic diagram of another embodiment of a repeater circuit.

Another embodiment of a repeater circuit is shown in FIG. 2. It is noted that some devices (e.g., transistors) that perform identical functions to their counterparts shown in FIG. 1 may have different reference designators (e.g., P13 and N13 perform identical functions to their counterparts shown in FIG. 1, P12 and N11). In the embodiment shown, repeater 15 is arranged into functional units in a manner similar to that of repeater circuit 10. However, input circuits 31 and 32 are implemented with a circuit topology different from their counterparts of repeater circuit 10. Furthermore, reverse circuits 25 and 26 are coupled to provide enable signals to input circuits 31 and 32, respectively, in this particular embodiment.

Input circuit 31 in the embodiment shown includes a pull-up network (transistors P5 and P6) and a pull-down network (transistors N5 and N6). In addition, input circuit 31 also includes a 2-input NOR gate G21, which is coupled to receive a complement of the clock signal (via inverter I3) and a first enable signal, 'en_high_', from reverse circuit 25. The first enable signal provided by reverse circuit 25 is a complement of the first inhibit signal, and is output from inverter I1, and is consider asserted when low. When the first enable signal is asserted and the output of inverter I3 is low (responsive to the clock signal being high), NOR gate G21 outputs a logic high to the gate terminal of N6. If the input data signal is concurrently high on the gate of transistor N5, the pull-down network of input circuit 31 is activated. This in turn results in the 'drivehigh_' node being pulled low and the corresponding activation of transistor P13. When the enable signal is not asserted, NOR gate G21 outputs a logic low to transistor N6, thereby preventing activation of the pull-down network. If the input data signal is low concurrent with the clock signal being high, transistors P5 and P6 are activated, and thus the 'drivehigh_' node is pulled high, thus deactivating (or preventing activation of) transistor P13. If the clock signal is low, neither the pull-up network nor the pull-down network of input circuit 31 may be activated.

Input circuit 32 includes a 2-input NAND gate G22, which is coupled to receive the clock signal and a second enable signal, 'en_low', from reverse circuit 26. The second enable signal is considered asserted when high in this embodiment. When both the clock signal and the second enable signal are high, NAND gate G22 outputs a low to the gate terminal of transistor P7. If the input data signal received via node 'd' is also low, transistor P8 is also activated, and thus 'drivelow' is pulled high. Otherwise, if the input data signal is high concurrent with the clock signal being high, transistors N7 and N8 are activated, thereby pulling 'drivelow' low and deactivating (or inhibiting activation of) transistor N13. If the second enable signal is de-asserted, NAND gate G22 outputs a logic 1, thereby preventing activation of the pull-up network by preventing activation of transistor P7. If the clock signal is low, neither the pull-up network nor the pull-down network of input circuit 32 may be activated.

Figure 3:
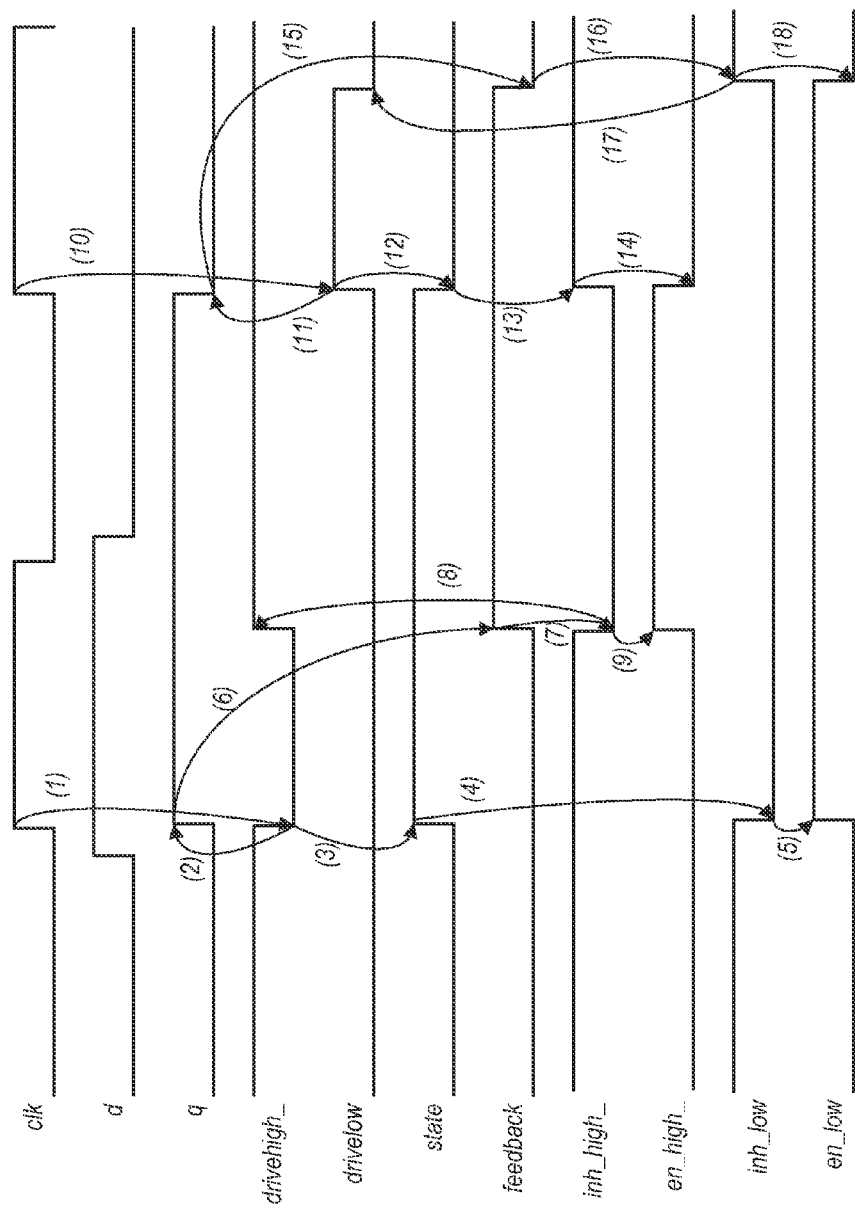
FIG. 3 is a timing diagram illustrating operation of one embodiment of a repeater circuit.
Figure 4:
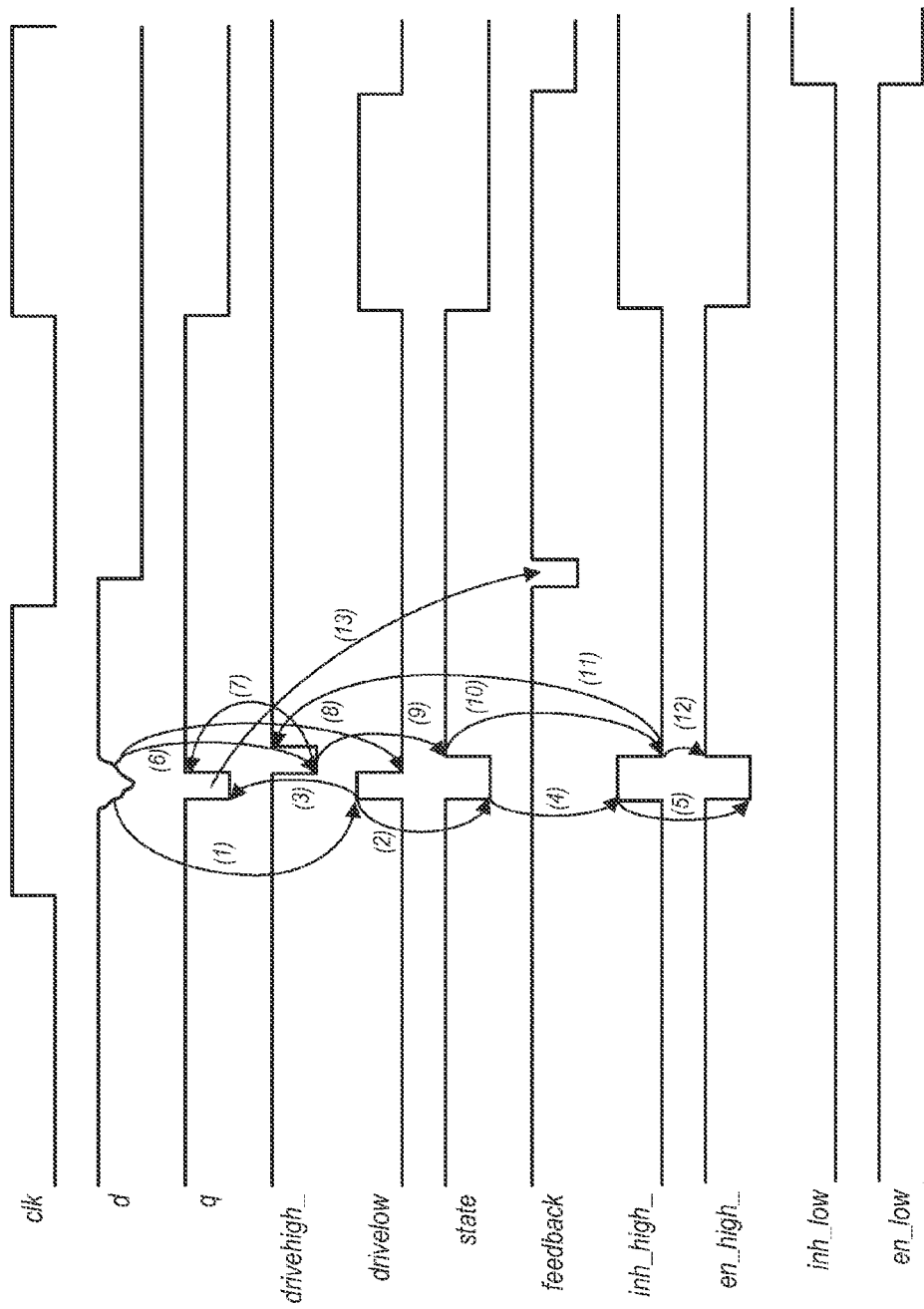
FIG. 4 is a timing diagram further illustrating operation of one embodiment of a repeater circuit.

Timing Diagrams:

FIGS. 3 and 4 are timing diagrams that further illustrate the functioning of one embodiment of a repeater circuit. More particularly, FIGS. 3 and 4 are directed to the embodiment of repeater circuit 15 shown in FIG. 2. FIG. 3 illustrates an example of glitch-free operation of repeater circuit 15. FIG. 4 illustrates an example recovery from a glitch occurring after a low-to-high transition of the input data signal. It is noted that repeater circuit 10 of FIG. 1 may function in a similar manner, although certain signals (e.g., the enable signals) are not present in that embodiment, and the times at which some devices turn on or off may be slightly different. It is further noted that the discussion presented herein may use node names and signal names interchangeably. For example, the input data signal and the node on which it is received may be both be referred 'd', which is shown in FIGS. 1 and 2 as the node upon which this signal is received.

In the example shown in FIG. 3, the input data signal received on node 'd' undergoes a low-to-high transition while the clock signal is still low. The state, feedback, and first enable ('en_high_') are all low as well, while the first inhibit signal ('inh_high_') is high. Prior to the clock transitioning high, the input data signal transitions high. At (1), the clock signal transitions high, resulting in the first input circuit activating its pull-down network and thus pulling 'drivehigh_' low. Responsive to 'drivehigh_' being pulled low, transistor P13 is activated and the output signal on 'q' is pulled high at (2). In addition, when 'drivehigh_' is pulled low, the input to NAND gate G3 causes the state signal to undergo a low-to-high transition at (3). When the state signal transitions high, transistor N4 is activated, and thus 'inh_low' is de-asserted by being pulled low at (4). The low-to-high transition of the state signal also results in a high on the gate terminal of transistor N1, although the state held by the keeper of reverse circuit 25 is not affected since transistor N2 is off due to the fact that the feedback signal is still low. Responsive to the high-to-low transition of 'inh_low', inverter I2 asserts the second enable signal, en_low, at (5). This effectively "arms" the input circuit 32, enabling it to activate without any substantial delay if the input data signal falls low when the clock signal is high.

At (6), the feedback signal transitions high. The transitioning high of the feedback signal is responsive to the low-to-high transition of the output signal on 'q', and occurs at a delay time thereafter that is determined by the delay introduced by feedback circuit 27. When the feedback signal transitions high, the high is received on the gate terminal of transistor N2. Since transistor N1 already has a high on its gate terminal due to the state signal being high, both transistors N1 and N2 become active and assert low the first inhibit signal, 'inh_high_' at (7). Responsive to the first inhibit signal being asserted low, the 'drivehigh_' signal is pulled high at (8), thereby deactivating P13. The low-to-high transition of 'drivehigh_' results, in part, from the assertion of the first inhibit signal, which causes the activation of transistor P9 and the deactivation of transistor N10. In addition, when the first inhibit signal is asserted, the first enable signal is de-asserted, transitioning from low to high at (9), thereby causing NOR gate G21 to output a low to transistor N6 and thus deactivate this device. Accordingly, the pull-down path from 'drivehigh_' to ground is cut off when the feedback signal transitions high, while a pull-up path from 'drivehigh_' to Vdd is invoked.

After transistor P13 is deactivated, the output signal on 'q' remains at a logic high level, held by the output of inverter I6. Furthermore, the output signal remains held high after the clock signal falls low in this example.

Prior to the next low-to-high transition of the clock signal, the input data signal received on 'd' falls low. When the clock signal again transitions high, at (10), 'drivelow' is pulled high, thereby causing activation of transistor N13. The pulling high of 'drivelow' results from the activation of transistor P7 and P8 in input circuit 32. Transistor P8 receives a low on its gate terminal when the input data signal falls low. When the second enable signal, 'en_low' is asserted high concurrent with the clock signal being high, NAND gate G22 outputs a logic low to the gate terminal of transistor P7. Responsive to lows on their respective gate terminals, transistors P7 and P8 are both activated and pull 'drivelow' high and thus cause the activation of transistor N13. The actiavation of transistor N13 causes the output signal on 'q' to be driven low, at (11). Furthermore, when 'drivelow' is pulled high, the state signal falls low, at (12), in response thereto. When the state signal falls low, transistor P2 is activated while transistor N1 is deactivated, and thus the first inhibit signal de-asserted high, at (13). Responsive to the de-assertion of the first inhibit signal, the first enable signal, 'en_high_' is asserted low at (14). When the first enable signal is asserted (and the first inhibit signal is de-asserted), input circuit 31 is effectively "armed" and enabled to activate should a low-to-high transition of the input data signal occur when the clock signal is high.

At (15), the feedback signal falls low at the delay time subsequent to the output signal falling low on 'q'. When the feedback signal falls low, the respective gate terminals of transistors P3 and P4 are both low. Accordingly, both of these devices are activated, thereby asserting the second inhibit signal, 'inh_low', at (16). When the second inhibit signal is asserted, 'drivelow' is pulled low at (17) and the second enable signal is de-asserted at (18). The assertion of the second inhibit signal activates transistor N11, providing a pull-down path from 'drivelow' to ground. Transistor P11 is also deactivated responsive to the assertion of the second inhibit signal, while the de-assertion of the second enable signal results in NAND gate G22 outputting a high to transistor P7. Accordingly, the pull-up paths from 'drivelow' to Vdd are cut off at approximately the same time the activation of N11 provides the pull-down path. When 'drivelow' falls low, transistor N13 is deactivated. However, the low on 'q' is held by the output of inverter 16.

FIG. 4 illustrates exemplary operation of repeater circuit 15 when a glitch occurs on 'd' when the input and output signals are initially high at the rising clock edge. The initial conditions in this example are 'd', 'q', and the state signal high, with the remaining signals in their respective quiescent states that follow a low-to-high transition and subsequent deactivation of the output stage.

Subsequent to the clock transitioning high, a glitch occurs on the 'd', in which the voltage thereon momentarily drops before recovering to substantially its original level. When the voltage on 'd' has fallen far enough (e.g., to Vdd/2), 'drivelow' transitions high at (1) causing 'state' to fall low at (2). The transition high of 'drivelow' occurs when transistors P7 and P8 receive lows on their respective gate terminals. When these two devices are active, the drive strength through the pull-up path is sufficient to pull 'drivelow' high while also overriding a previous low held by keeper 24. The state signal falls low responsive to the high from 'drivelow' that is input into scan master latch 28. Transistor N13 is activated when 'drivelow' is pulled high, thereby causing 'q' to be pulled low at (3).

When the state signal falls low transistor P2 is activated and thus the first inhibit signal is de-asserted, at (4). At (5), inverter I1 outputs a logic low, thereby asserting the first enable signal. At this point, input circuit 31 is armed for a low-to-high transition when the voltage level on 'd' recovers from the glitch. It is noted that the respective states of the second inhibit and second enable signals does not change at this point. This is due to the high on the feedback node, which prevents activation of transistor P3 and thus the pull-up stack of reverse circuit 26. Accordingly, the keeper formed by inverter 12 and transistor N3 continues to hold the second inhibit signal low and while the second enable signal is held high.

At (6), the voltage level on 'd' has begun rising again as the glitch subsides. Once the voltage has reached a sufficient level moving upward, transistor P6 is deactivated and transistor N5 is activated. This in turn deactivates the pull-up network while activating the pull-down network of input circuit 31. Accordingly, at (6), 'drivehigh_' is pulled low. Responsive to 'drivehigh_' being pulled low, transistor P13 is activated and the output signal on 'q' is driven high at (7). Furthermore, at (8), 'drivelow' falls low, as the rising voltage on 'd' causes the activation of transistor N7 and deactivation of transistor P8. Responsive to the pulling low of 'drivelow' transistor N13 is deactivated.

At (9), the falling low of 'drivehigh_' causes the state signal to undergo a low-to-high transition. When the state signal transitions high, transistor N1 has a high on its respective gate terminal, as does transistor N2 since the feedback signal is still high. Accordingly, at (10), the first inhibit signal is asserted low. Assertion of the first inhibit signal low results in the activation of transistors P9, thereby causing 'drivehigh' to be pulled high at (11) and thus causes transistor P13 to be deactivated. Furthermore, when the first inhibit signal is asserted low, inverter I1 outputs a high, thereby de-asserting the first enable signal, at (12). The second enable signal remains asserted high, and thus input circuit 32 is armed for the next high-to-low transition on the 'd' input that occurs concurrent with the clock signal being high.

At (13), the feedback signal momentarily falls low. This momentary drop in the feedback signal occurs at the delay time subsequent to the initial response on 'q' to the glitch. However, the falling low of the feedback signal at this point does not affect the state of the other signals. Since the state signal is high at this point, the falling low of the feedback signal does not activate the pull-up network of reverse circuit 26. The temporary deactivation of transistor N2 resulting from the falling low of the feedback signal at (13) may cause the first inhibit signal to momentarily float. However, the amount of time that the first inhibit signal floats is limited to the time that the feedback signal is temporarily low. When the feedback signal returns high, transistor N2 is re-activated and the first inhibit signal is again driven low to its asserted state.

Integrated Circuit:

FIG. 5 is a block diagram of one embodiment of an exemplary integrated circuit (IC) illustrating one possible application of repeater circuit 15. It is noted that a similar application of repeater circuit 10 is also possible and contemplated. It is further noted that only those portions of IC 100 necessary for illustrative purposes are shown.

In the embodiment shown, IC 100 includes a first logic unit 105 and a second logic unit 110. A pair of 2-1 multiplexers 103 are coupled to receive signals (data signals A1, B1, A2, B2; select signals S1, S2) from logic unit 105. The outputs of multiplexers 103 (C1, C2) in this particular example are coupled to long distance signal connections that cross a clock boundary and further require a repeater circuits 15 to counter the resistance and capacitance effects typical with long distance interconnects. The 'd' input of each repeater circuit 15 is coupled to an output of a corresponding multiplexer 103. The 'q' output of each repeater circuit 15 is coupled to logic unit 110. Each repeater circuit 15 is further coupled to receive a clock signal provided by clock generator 106. Signals transmitted from multiplexers 103 may be received by their correspondingly coupled repeater circuit 15, with their states captured when the clock is high and held after the clock falls low again.

Repeater circuits 15 may be useful with circuits such as multiplexers as shown herein. Such multiplexers can produce glitches when the select signal changes the input selection. Accordingly, the use of repeater circuits 15 may enable recovery from such glitches to ensure that the proper data value is received at the receiving end of the long-distance interconnect.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
    an input stage configured to receive an input data signal and further configured to receive a clock signal having a first phase and a second phase;
    an output stage having a first driver circuit and a second driver circuit and configured to drive an output signal on an output node to a first state responsive to a first transition of the input data signal on an input node concurrent with the first phase of the clock signal, wherein the input stage is configured to activate a first driver circuit responsive to detecting the first transition of the input data signal and wherein the input stage is configured to cause the second driver circuit of the output stage to drive the output node to a second state responsive to the second transition irrespective of whether the second transition occurs before or after the delay time has elapsed;
    a reverse stage having a first reverse circuit configured to assert a first inhibit signal at a delay time subsequent to activation of the first driver circuit, and a second reverse circuit configured to assert a second inhibit signal at the delay time subsequent to activation of the second driver circuit, wherein the first driver circuit is configured to be deactivated responsive to assertion of the first inhibit signal and wherein the second driver circuit is configured to be deactivated responsive to assertion of the second inhibit signal, and wherein the reverse stage is further configured to prevent assertion of the first inhibit signal responsive to a second transition of the input data signal occurring before the delay time has elapsed subsequent to the first transition of the input data signal; and
    a feedback circuit having a respective input coupled to the output node and a respective output coupled to the first and second reverse circuits, wherein responsive to a state change of the output node, the feedback circuit is configured to drive a corresponding state change on its respective output at a delay time subsequent to the state change on the output node.

2. The circuit as recited in 1, wherein the first state is a logic high state, and wherein the second state is a logic low state, and wherein the first transition of the input data signal is a low-to-high transition and wherein the second transition of the input data signal is a high-to-low transition.

3. The circuit as recited in claim 1, wherein the first reverse circuit is further configured to assert a first enable signal responsive to de-assertion of the first inhibit signal, and wherein the second reverse circuit is configured to assert a second enable signal responsive to de-assertion of the second inhibit signal, wherein the first reverse circuit is coupled to provide the first enable signal to a first input circuit of the input stage and wherein the second reverse circuit is coupled to provide the second enable signal to a second input circuit of the input stage.

4. The circuit as recited in claim 3, wherein the first input circuit is configured to cause activation of the first driver circuit responsive to the first transition of the input signal concurrent with the first phase of the clock signal and the assertion of the first enable signal, and wherein the second input circuit is configured to cause activation of the second driver circuit responsive to the second transition concurrent with the first phase of the clock signal and the assertion of the second enable signal.

5. The circuit as recited in claim 3, wherein the first input circuit is inhibited from causing activation of the first driver circuit during the second phase of the clock signal, and wherein the second input circuit is configured is inhibited from causing activation of the second driver circuit during the second phase of the clock signal.

6. The circuit as recited in claim 5, wherein the first input circuit includes a first pull-up network and a first pull-down network, wherein the second input circuit includes a second pull-up network and a second pull-down network, and wherein:
    responsive to a low-to-high transition of the input data signal, the first pull-down network is configured to activate the first driver circuit;
    responsive to a high-to-low transition of the input data signal, the first pull-up circuit is configured to deactivate the first driver circuit;
    responsive to a high-to-low transition of the input data signal, the second pull-up circuit is configured to activate the second driver circuit; and
    responsive to a low-to-high transition of the input data signal, the second pull-down circuit is configured to deactivated the second driver circuit.

7. The circuit as recited in claim 1, further comprising a scan master latch coupled to provide a state signal to the first reverse circuit and the second reverse circuit, wherein the first reverse circuit is configured to assert the first inhibit signal if the state signal is a logic high and a feedback signal is a logic high, and wherein the second reverse circuit is configured to assert the second inhibit signal if the state signal is a logic low and the feedback signal is a logic low.

8. A repeater circuit comprising:
    an input stage having first and second input circuits each coupled to receive an input data signal and a clock signal;
    an output stage having first and second driver circuits each coupled to an output node, wherein the first driver circuit is configured to drive the output node responsive to activation of the first input circuit, and wherein the second driver circuit is configured to drive the output node responsive to activation of the second input circuit; and
    a reverse stage having first and second reverse circuits, wherein the first reverse circuit is configured to assert a first inhibit signal responsive to receiving a state signal in a first logic state and a feedback signal in the first logic state, and wherein the first reverse circuit is configured to cause the first driver circuit to be inactive responsive to assertion of the first inhibit signal; and
    wherein the second reverse circuit is configured to assert a second inhibit signal responsive to receiving the state signal in a second logic state and the feedback signal in the second logic state, wherein the second reverse circuit is configured to cause the second driver circuit to be inactive responsive to assertion of the second inhibit signal.

9. The repeater circuit as recited in claim 8, further comprising:
    a scan master latch, wherein the scan master latch is configured to output the state signal at a logic state equivalent to that of the output signal; and a feedback circuit having a respective input coupled to the output node and an output coupled to the first and second reverse circuits, wherein the feedback circuit is configured to, after a delay time, provide the feedback signal at a logic state equivalent to that of the output signal.

10. The repeater circuit as recited in claim 9, wherein the first reverse circuit is configured to, at the delay time subsequent to a low-to-high transition of the output signal, assert the first inhibit signal at a logic low level, wherein the first driver circuit is configured to be deactivated responsive to the assertion of the first inhibit signal;

and wherein the second reverse circuit is configured to, at the delay time subsequent to a high-to-low transition of the output signal, assert the second enable signal at a logic high level, wherein the second driver circuit is configured to be deactivated responsive to the assertion of the second inhibit signal.

11. The repeater circuit as recited in claim 10, wherein the first reverse circuit is configured to de-assert the first inhibit signal responsive to a high-to-low transition of the state signal, and wherein the second reverse circuit is configured to de-assert the second inhibit signal responsive to a low-to-high transition of the state signal.

12. The repeater circuit as recited in claim 11, wherein the first reverse circuit is further configured to assert a first enable signal responsive to the high-to-low transition of the state signal, wherein the first input circuit is enabled when the first enable signal is asserted and disabled when the enable signal is de-asserted, wherein the second reverse circuit is further configured to assert a second enable signal responsive to the low-to-high transition of the state signal, wherein the second input circuit is enabled when the second enable signal is asserted and disabled when the enable signal is de-asserted.

13. The repeater circuit as recited in claim 11, wherein the first input circuit includes a first pull-up network and a first pull-down network, wherein the first pull-down network is configured to be activated when the first enable signal is asserted concurrent with the clock signal being high and the low-to-high transition of the input data signal, and wherein the first pull-up network is configured to be activated when the clock signal is high concurrent with the high-to-low transition of the input data signal;

wherein the second input circuit includes a second pull-up network and a second pull-down network, wherein the second pull-up network is configured to be activated when the second enable signal is asserted concurrent with the clock being high and the high-to-low transition of the input data signal, and wherein the second pull-down network is configured to be activated when the clock signal is high concurrent with a low-to-high transition of the input data signal.

14. The repeater circuit as recited in claim 8, wherein the first input circuit is configured to cause activation of the first driver circuit when the clock signal, the input data signal, and the first inhibit signal are high, and wherein the second input circuit is configured to cause activation of the second driver circuit when the clock signal is high and when the data input signal and the second inhibit signal are low.

15. A circuit comprising:
a first input circuit coupled to receive an input data signal and a clock signal;
a second input circuit coupled to receive the input data signal and the clock signal;
a first driver circuit configured to drive an output signal on an output node to a logic high level, wherein the first input circuit is configured to activate the first driver circuit responsive to a low-to-high transition of the input data signal concurrent with the clock signal being high;
a second driver circuit configured to drive the output signal on the output node to a logic low level, wherein the second input circuit is configured to activate the second driver circuit responsive to a high-to-low transition of the input data signal concurrent with the clock signal being high;
a first reverse circuit configured to assert a first inhibit signal responsive to receiving a state signal at a logic high level and a feedback signal at the logic high level, and wherein the first reverse circuit is configured to cause the first driver circuit to be inactive responsive to assertion of the first inhibit signal; and
a second reverse circuit configured to assert a second inhibit signal responsive to receiving the state signal in a logic low level and the feedback signal at the logic low level, wherein the second reverse circuit is configured to cause the second driver circuit to be inactive responsive to assertion of the second inhibit signal.

16. The circuit as recited in claim 15, further comprising:
a scan master latch coupled to provide the state signal to the first and second reverse circuits, wherein the scan master is configured to provide the state signal at the logic high level responsive to the first input circuit activating the first driver circuit and further configured to provide the state signal at the logic low level responsive to the second input circuit activating the second driver circuit;
a feedback circuit having an input coupled to the output node and an output coupled to the first and second reverse circuits, wherein the feedback circuit is configured to provide the feedback signal at a logic high level at a delay time subsequent to a low-to-high transition of the output node, and wherein the feedback circuit is further configured to provide the feedback signal at a logic low level at the delay time subsequent to a high-to-low transition of the output node.

17. The circuit as recited in claim 15, wherein the first reverse circuit is further configured to assert a first enable signal responsive to receiving the state signal at a logic low level and wherein the second reverse circuit is configured to assert a second enable signal responsive to receiving the state signal at a logic high level;

wherein the first input circuit includes a first pull-up network configured to be activated when the clock signal is high concurrent with a high-to-low transition of the input data signal, and further includes a first pull-down network configured to be activated when the clock signal is high and the first enable signal is asserted low concurrent with a low-to-high transition of the input data signal; and wherein the second input circuit includes a second pull-up network configured to be activated when the clock signal and the second enable signal are each high concurrent with the high-to-low transition of the input data signal, and further includes a second pull-down network configured to be activated when the clock signal is high concurrent with a low-to-high transition of the input data signal;

wherein the first pull-up circuit, the first pull-down circuit, the second pull-up circuit, and the second pull-down circuit are inhibited from activation when the clock signal is low.

* * * * *

UNITED STATES PATENT AND TRADEMARK OFFICE
CERTIFICATE OF CORRECTION

PATENT NO. : 8,525,566 B2
APPLICATION NO. : 13/210587
DATED : September 3, 2013
INVENTOR(S) : Dixit et al.

Page 1 of 1

It is certified that error appears in the above-identified patent and that said Letters Patent is hereby corrected as shown below:

In the Specification

In column 3, line 65, delete "13" and insert -- I3 --, therefor.

In column 5, line 50, delete "16" and insert -- I6 --, therefor.

In column 6, line 21-22, delete "'drivehigh_" and insert -- 'drivehigh_' --, therefor.

In column 8, line 27, delete "en_low," and insert -- 'en_low', --, therefor.

In column 9, line 1, delete "actiavation" and insert -- activation --, therefor.

In column 9, line 31, delete "16." and insert -- I6. --, therefor.

In column 9, line 63, delete "12" and insert -- I2 --, therefor.

In the Claims

In column 11, line 51, in Claim 2, after "in" insert -- claim --.

Signed and Sealed this
Thirty-first Day of December, 2013

Margaret A. Focarino
*Commissioner for Patents of the United States Patent and Trademark Office*